United States Patent [19]

Barnoski

[11] 4,227,163
[45] Oct. 7, 1980

[54] ELECTRICAL KEYSWITCH

[75] Inventor: Raymond Barnoski, Chicago, Ill.

[73] Assignee: Illinois Tool Works Inc., Chicago, Ill.

[21] Appl. No.: 17,875

[22] Filed: Mar. 5, 1979

[51] Int. Cl.³ .............................................. H01H 9/00
[52] U.S. Cl. .............................. 335/205; 340/365 L; 200/159 R; 335/206
[58] Field of Search ...................... 335/205, 206, 207; 340/365 L, 365 E; 200/159 R, 159 A, 160

[56] References Cited

U.S. PATENT DOCUMENTS

| 3,638,221 | 1/1972 | Bernin | 340/365 L |
| 3,902,032 | 8/1975 | Koepke | 200/159 A |
| 3,978,474 | 8/1976 | Engstrom | 340/365 E |
| 4,017,850 | 4/1977 | Wanatowicz | 340/365 L |
| 4,028,696 | 6/1977 | Maoland et al. | 340/365 L |
| 4,099,176 | 7/1978 | Bernin et al. | 340/365 L |

OTHER PUBLICATIONS

MPS Pushbutton Switches, Centralab, Electronic Division Globe-Union Inc., Fort Dodge, Iowa.

New Low-Profile Solid State Keyboards, Micro Switch, Freeport, IL.

Primary Examiner—George Harris
Attorney, Agent, or Firm—Glenn W. Bowen; Robert W. Beart

[57] ABSTRACT

A low profile keyswitch for electrical keyboards is disclosed which has the capability of being operated either as a contactless analog type of keyswitch, or as a mechanical contact type of keyswitch. The keyswitch may include a pair of normally-closed contacts that are opened when a separator bar that is integrally formed in the interior of the plunger passes between the contacts as the plunger is depressed. Alternately, a permanent magnet may be carried on one side of the plunger to control the magnetic saturation state of a closed-loop magnetic core which, along with a pair of U-shaped conductive lines that thread through the core, is inserted into a retaining well formed by a pair of walls that project upwardly from a horizontal surface of the base at a location adjacent the side of the plunger that carries the magnet.

4 Claims, 3 Drawing Figures

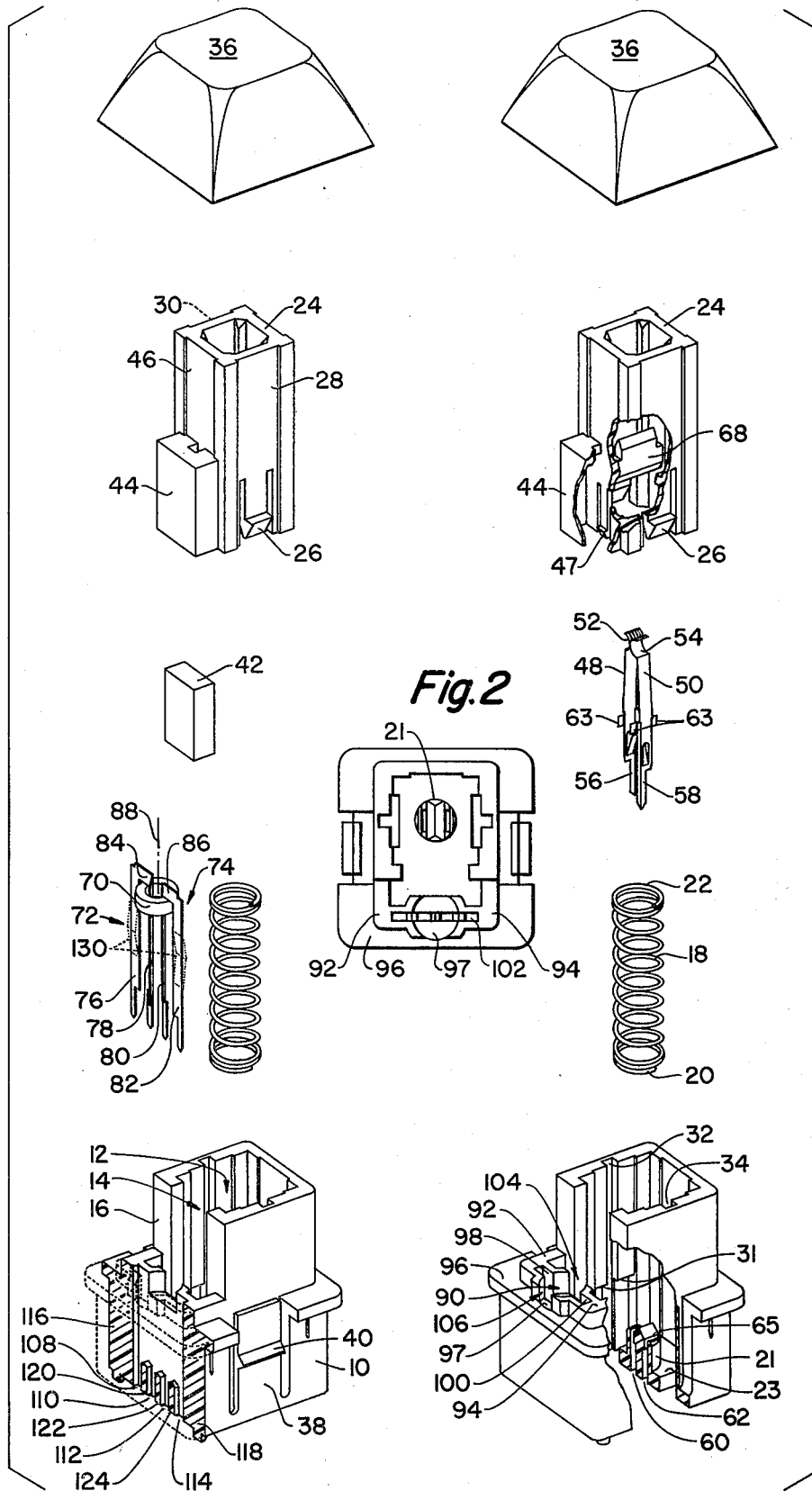

ELECTRICAL KEYSWITCH

BACKGROUND OF THE INVENTION

Keyswitches for electrical keyboards may be either of the mechanical contact type or of the analog contactless type, wherein a magnet controls the actuation state of the switch by determining the saturation state of a closed-loop magnetic core that is threaded by drive and sense lines.

The mechanical type of keyswitch has the advantage of being relatively low in cost, and for many applications this factor makes it desirable to employ such a mechanical keyswitch. However, mechanical keyswitches have a number of disadvantages that make them undesirable for use in applications where high reliability is required and the added cost of a analog switch is, therefore, considered to be warranted. These disadvantages include contact bounce, the possibility of arcing, lower life times due to pitting and corrosion and possible deformation of the contact members.

Analog switches, such as the magnetic saturable core, offer greatly improved reliability, but at a higher cost. In addition, such switches generally require some sort of circuit modification to supply "hysteresis," or a reduced sensitivity of the sensing circuit after a keyswitch has been actuated to prevent electrical noise from producing false output signals. In applications where high reliability is necessary, however, analog switches provide the utmost in dependability and endurance.

It would be desirable for keyboard manufacturers to have the capability of making keyboards with either type of keyswitch, in accordance with their customer's wishes. However, previously this has required the manufacture and stocking of two separate types of keyswitches, with added cost and complications.

The electrical keyswitch of the present invention provides a simple electrical keyswitch that is capable of being operated either as an analog magnetic type of contactless keyswitch or as a mechanical type of keyswitch with only minor modifications being necessary to convert from one to the other, due to the improved design provisions that are provided for the keyswitch. In addition, for special applications, both types of keyswitches could be simultaneously incorporated into one keyswitch component if desired.

The keyswitch of the present invention is designed to accept flat drive and sense line conductors, wherein these conductors could be inserted into the switch with automatic machinery. The magnetic sensing core is positioned onto one leg of a U-shaped drive line and onto one leg of a U-shaped sense line and the core with the two linking lines is then inserted into a retaining well formed on the base of the keyswitch from the top of the switch. The retaining well is formed by a walled configuration that consists of a pair of vertically extending walls that project upwardly from the horizontal surface on the base of the keyswitch. Each of the retaining walls has a groove in it and the horizontal surface has a slot through it which runs beneath the grooves and the walls so that the drive and sense line conductors may be positioned through the horizontal surface in the upstanding walls as the magnetic core is positioned in the retaining well. The magnetic core and the drive and sense lines are retained in the base of the keyswitch only by closeness of the fit between the drive lines and the receiving portions of the base. Thus, a defective magnetic core may be easily removed merely by pressing upwardly on the leads so that the leads and the core are removed from the keyswitch without disassembly of any portion of the device. This improved design allows for rapid replacement of defective sensing cores while at the same time, by confining the analog switching components to the exterior of the plunger and to one side of the base of the keyswitch, allows the interior of the keyswitch to be used to retain the mechanical switching components therein.

DESCRIPTION OF THE DRAWINGS

The present invention is described by reference to the drawings in which:

FIG. 1 is an exploded perspective view of the keyswitch when it is employed as a magnetic analog contactless type of keyswitch utilizing a magnetic core;

FIG. 2 is a top view of the base of the keyswitch, which is shown at twice the size of the exploded view of FIG. 1;

FIG. 3 is an exploded perspective view of the keyswitch when it is employed as a mechanical type of keyswitch.

TECHNICAL DESCRIPTION OF THE INVENTION

The keyswitch of the present invention is shown in its analog version in FIG. 1, and in its mechanical version in FIG. 3. FIG. 2 shows a top view of the base of the keyswitch, which is formed of an electrically insulating plastic material. The base 10 of the keyswitch is formed with an integrated, hollow, generally rectangular-shaped guide chamber 12 that extends upwardly from the base and has a slot 14 formed in the side 16 of the chamber. A coiled return spring 18 is inserted into the guide chamber 12 with the lower end 20 of the spring receiving the projection 21 that extends upwardly from the bottom surface 23 of the base. The upper end 22 is inserted into the hollow, generally rectangular-shaped plunger 24 in order to bias it upwardly so as to return it to its initial position after the plunger has been depressed and pressure on the plunger has been released.

The plunger 24 has a pair of resilient looking feet 26 on the opposite sides 28, 30 of the plunger to hold it in the guide chamber 12. When the feet 26 are pressed inwardly, the plunger is inserted into the guide chamber and then the inward pressure on the feet is released so that they will spring outwardly and engage the surfaces 31 in the interior of the guide chamber so as to prevent the plunger from being inadvertently removed from the guide chamber. Two elongated generally rectangular shaped grooves 32, 34, on opposite interior surfaces of the guide chamber 12, are provided so that a tool may be inserted into the guide chamber that can depress the feet 26 inwardly when the plunger is to be removed.

A key cap 36 is provided which will indicate the identifying indicia for a particular key and which snaps on the top of the plunger. The base 10 of the keyswitch has a pair of resilient arms 38 on opposite sides of the base. The arms have a projection 40 that allows the keyswitch to be locked into an aperture in a printed circuit board, or other suitable support member, for the keyswitch.

The plunger 24 of the keyswitch is adaptable to provide an analog type of contactless switch when a small magnet 42 is inserted into the container 44 that is carried on the side 46 of the plunger, and held in place by a resilient locking foot 47. The side 46 of the plunger faces the side 16 of the guide chamber so that as the plunger moves up and down the magnet 42 and container 44 will correspondingly move up and down in the slot 14. By carrying the magnet on the side 46 of the plunger and by making the plunger hollow, the keyswitch is also adaptable for alternate, or simultaneous, use as a mechanical keyswitch.

The mechanical contacts 48, 50 are of the normally-closed type, and they are formed of two elongated conductive members that have C-shaped contact portions 52, 54 at their upper ends. Each of the contact portions 52, 54 are preferably formed of a multitude of individual contact fingers in order to achieve a high reliability contact. The lower ends 56, 58 of the contacts 48, 50 are reduced in size and project through the slots 60, 62 in the upstanding projection 21. The contacts also have outwardly projecting wings 63 that fit into corresponding horizontal grooves 65 in the projection 21 to retain the contacts 48, 50 in their proper positions in the switch.

The plunger 24 is made hollow so that the contact portions 52, 54 of the mechanical contacts extend up into the lower interior portion of the plunger. A separator bar 68, for separating the normally-closed contacts 48, 50 when the plunger is depressed, is integrally formed across the hollow of the plunger, preferably at a position vertically removed from the bottom of the plunger so as to provide for a low-profile keyswitch, which is desired by many keyboard users.

The analog type of keyswitch illustrated in FIG. 1 utilizes a closed loop, preferably a toroidal-shaped magnetically saturable magnetic core 70. In this type of switch the magnet 42 is located adjacent the core 70 when the plunger is not depressed. A U-shaped, flat drive line 72 and a U-shaped, flat sense line 74 are threaded through the core so that the sense line may pick up an electromagnetic signal when a pulse of current is supplied through the drive line, providing the core 70 is not magnetically saturated. When the plunger is in its undepressed position, the core 70 will be magnetically saturated and thus pulses of current on the drive line will not produce output signals on the sense line. However, when the plunger is depressed the magnet will move away from the core thereby allowing the core to come out of magnetic saturation so that the drive line signals will now be transformed to the sense line.

Although U-shaped drive and sense lines have previously been used in this type of keyswitch, they were generally formed of round wires and thus previous drive and sense line configurations did not lend themselves readily to automatic manufacture where a large number of such lines could be formed merely by stamping out a single sheet of conductive metal. Such stamped conductors provide for low-cost components that are suitable for automated handling. The drive and sense lines that are formed in this manner each have a pair of parallel straight legs, such as the legs 76, 78, 80 and 82, and sections between the legs, such as the sections 84, 86, that are located above the core 70 when the core is positioned so that its axis 88 is oriented in a vertical direction, as shown in FIG. 1.

The keyswitch of the present invention is designed to facilitate insertion of the flat drive and sense lines and the core into their final position in the assembled keyswitch. The core 70 is retained in a retaining well 90 which is formed of a pair of upstanding walls 92, 94 that extend vertically from the horizontal surface 96 on the base 10. When the core 70 is held in the retaining well 90, the bottom, or lowermost portion of the core rests on the horizontal surface 97 and the top, or uppermost portion, of the core is uncovered and the axis 88 of the core is then vertically oriented. The walls 92, 94 have the grooves 98, 100 respectively formed in them so that the outer legs 76 and 82 of the drive and sense lines, respectively pass through these grooves when the core and the sense lines are inserted into the switch. An elongated slot 102, as seen in FIG. 2 passes through the surface 97 and extends below the grooves 98, 100 so that all of the legs 76-82 of the drive and sense lines may pass through the slot 102. The walls 92, 94 are spaced to provide an opening 104 adjacent the side 46 of the plunger so as to reduce the clearance between the core and the magnet. Another opening 106 is provided on the opposite side of the walls to allow for visual inspection of the switch to see if it is carrying a core.

In assembling, the magnetic core 70 may first be inserted from the bottom of the drive and sense lines, to the position shown in FIG. 1. The drive and sense lines and the core may then be pressed downwardly as a unit so that the legs 76, 78, 80 and 82 pass through the corresponding receiving passageways 108, 110, 112, and 114, respectively, that are formed in the interior of the base by the outer walls 116, 118 of the base and the three elongated, generally parallel, electrically insulating dividers 120, 122, 124.

The described retaining and assembly provisions for core 70 and the drive and sense lines 72, 74 allow for easy insertion of these elements into the keyswitch. The passageways provided for the leads are dimensions so that they are tight fitting with respect to the drive and sense lines. The leads, however, may be additionally bent as represented by the dotted lines 130 on the legs 76, 82 if a tighter fit is desired. In such a case, the switches may even be turned upside down without the core and the drive lines dropping out; but they can still be easily removed by pressure on the bottom of the leads.

The core and drive line assembly thus may be very easily removed without disassembly of any other part of the keyswitch if replacement of a defective core becomes necessary. This easy removal of defective sensing elements gives the keyswitch of the present invention a decided advantage over prior analog types of contactless switches.

What is claimed is:

1. In an electrical keyswitch comprising a base having a vertically extending guide chamber and a horizontal surface, a depressible plunger mounted for up and down movement within said guide chamber, a return bias spring positioned in said guide chamber so as to bias said plunger upwardly toward its undepressed position, a permanent magnet carried externally on one side of said plunger so as to move up and down therewith, a closed-saturable magnetic core, a U-shaped drive line having two substantially straight parallel legs that has one of said legs located in the loop of said core with an adjoining strip of said drive line running between its two legs and being located above said core and a U-shaped, sense line having two substantially straight parallel legs that has one of said legs located in the loop of said core so as to run parallel to the leg of said drive line that is located in said loop with a joining strip of said sense line running between its two legs and being located above said core, wherein said permanent magnet is positioned adjacent said core when said plunger is not depressed so that said core is substantially magnetically saturated, and so that said permanent magnet moves away from said core when said plunger is depressed, thereby allowing said core to come out of magnetic saturation; the movement comprising a plurality of electrically insulating, elongated, parallel dividers that are integrally formed on said base and are located below said horizontal surface in the interior of said base adjacent the side of said base that is adjacent said permanent magnet so that said dividers in conjunction with said base provide four separate elongated passageways and a pair of walls that extend vertically upward from said horizontal surface that are shaped to form a retaining well for said core so that the bottom of said core rests on said horizontal surface and the top of said core is uncovered and the axis of said core is vertically oriented, said walls each having a groove therein, one of said grooves positioned to allow said drive line to pass therethrough and the other of said grooves positioned to allow said sense line to pass therethrough, said horizontal surface having a slot therein which allows both of said drive and sense lines to pass therethrough, with each of said legs of said drive and sense lines being confined to operate in one of said passageways that are provided by said dividers so that the lower ends of said legs extend out of the bottom of in said base at different, electrically insulated locations, said passageways.

2. In an electrical keyswitch, as claimed in claim 1, a further improvement comprising substantially flat, stamped drive and sense lines.

3. In an electrical keyswitch, as claimed in claim 2, the further improvement comprising an integral protrusion that extends vertically from a second horizontal surface of the base into the interior of the base which has two electrically insulated passageways that run therethrough, a pair of normally closed elongated contacts that have terminal ends that extend through said slots out of the bottom of said base at different electrically insulated locations and an operator bar that is mounted interiorly in the hollow portion of said plunger which is constructed and positioned to pass between said contacts and thereby open the electrical circuit therebetween when said plunger is depressed.

4. In an electrical keyswitch, as claimed in claim 3, a further improvement comprising substantially flat, stamped drive and sense lines.

* * * * *

UNITED STATES PATENT AND TRADEMARK OFFICE
CERTIFICATE OF CORRECTION

PATENT NO. : 4,227,163
DATED : October 7, 1980
INVENTOR(S) : Raymond Barnoski

It is certified that error appears in the above-identified patent and that said Letters Patent are hereby corrected as shown below:

IN THE CLAIMS:

Column 5, line 3, "movement" should read --improvement--.

Column 6, line 3, add "of" before --said--.

Signed and Sealed this

Twenty-first Day of April 1981

[SEAL]

Attest:

RENE D. TEGTMEYER

Attesting Officer

Acting Commissioner of Patents and Trademarks